United States Patent
Iwamoto et al.

(10) Patent No.: US 6,784,519 B2
(45) Date of Patent: Aug. 31, 2004

(54) SEMICONDUCTOR DEVICE

(75) Inventors: Takashi Iwamoto, Urayasu (JP);
Makoto Yoshimura, Shizuoka-ken (JP);
Kenichi Hashizume, Gunma-ken (JP)

(73) Assignee: Nokia Mobile Phones Ltd., Espoo (FI)

( * ) Notice: Subject to any disclaimer, the term of this patent is extended or adjusted under 35 U.S.C. 154(b) by 24 days.

(21) Appl. No.: 10/052,266

(22) Filed: Jan. 23, 2002

(65) Prior Publication Data

US 2002/0109175 A1 Aug. 15, 2002

(30) Foreign Application Priority Data

Jan. 26, 2001 (JP) .......................................... 2001-019003
Dec. 3, 2001 (JP) .......................................... 2001-369182

(51) Int. Cl.[7] ........................ H01L 27/108; H01L 29/76; H01L 29/94; H01L 31/119; H01L 29/00
(52) U.S. Cl. .......................................... 257/532; 257/301
(58) Field of Search ................................ 257/295–310, 257/532–535, 777–781; 438/239–254

(56) References Cited

U.S. PATENT DOCUMENTS

| | | | | |
|---|---|---|---|---|
| 4,214,174 A | * | 7/1980 | Dickson | 327/356 |
| 5,394,000 A | * | 2/1995 | Ellul et al. | 257/301 |
| 5,745,333 A | * | 4/1998 | Frankeny et al. | 361/313 |
| 5,780,335 A | * | 7/1998 | Henkels et al. | 438/243 |
| 6,184,060 B1 | * | 2/2001 | Siniaguine | 438/106 |

* cited by examiner

*Primary Examiner*—Cuong Nguyen
(74) *Attorney, Agent, or Firm*—Antonelli, Terry, Stout & Kraus, LLP (57) ABSTRACT

A semiconductor device equipped with a buried type capacitor directly buried inside a semiconductor substrate, wherein three-dimensional cavities 11 each having an aperture on the front side of the flat semiconductor substrate 10 are formed aligned with each other on the substrate 10, a capacitor part A is provided by implementing a capacitor structure of a substrate-buried type inside the cavity 11, and semiconductor base bodies 101 including capacitor parts A, is provided.

19 Claims, 5 Drawing Sheets

SEMICONDUCTOR DEVICE

BACKGROUND OF THE INVENTION

1. Field of the Invention

The present invention relates to a semiconductor device employed in DSPs (digital signal micro processors), CPUs (central processing units), memory devices, computer memory, etc., for electronic devices such as computers; and in further detail, it relates to a semiconductor device equipped with a capacitor buried in a semiconductor substrate made from silicon etc.

2. Description of the Prior Art

With the progress in recent technology, content is transferred by the technology used for music distribution, animation, true color moving pictures, etc., and the development of electronic devices related thereto is under way. Various technical innovations on devices related to the transfer and/or multimedia in this field are being made.

Concerning technology regarding integrated circuit design and devices, key items are, for instance, a DSP (Digital Signal Processor), an MPU (Micro Processor Unit), and memory devices (such as ROM and RAM). Further required on such devices are designs capable of realizing higher control speed, larger memory capacity, and higher stability in performance.

In order to achieve high speed operation with the semiconductor devices based on IC chips and the like known heretofore, measures have been taken to directly attach proper external components such as chip capacitors (decoupling capacitors) to an interposer. Further concerning the internal structure of the semiconductor device, attempts have been made to newly employ copper, which replaces conventionally used aluminum, as the patterning material for forming circuits.

However, the semiconductor devices known heretofore failed to sufficiently achieve the requirements concerning, for instance, higher control speed, larger memory capacity, and higher stability in IC performance.

In semiconductor devices such as IC chips, a wire bonding method is employed in connecting each of the bonding pads (pads for drawing external electrodes), which are provided for the periphery of the surface of the device, with each of the lead electrodes of the lead frame. In addition to the above, wireless bonding methods are employed for forming joints without using wires, and among them, frequently employed are a flip-chip method using solder, bumps, etc., and a TAB method using bump tapes, etc.

Figure 7:
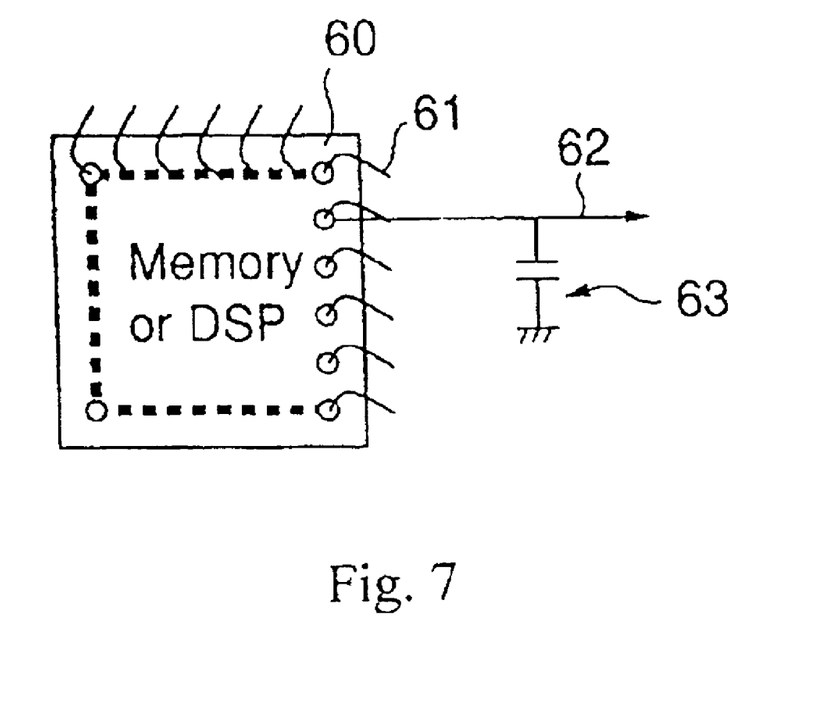
FIG. 7 shows an example of a semiconductor device of a conventional type, and is a schematically drawn outer appearance of a DRAM or a DSP device (60).

In FIG. 7 a schematically shown external appearance of a DRAM device and a DSP device (60) are illustrated as examples of semiconductor devices known in the art. A signal line is shown by an arrowhead (→) 62, which is externally connected with a chip capacitor (decoupling capacitor) 63, etc. A bonding wire 61 is disposed outward from the periphery of the device 60. Shown aligned therein are plural bonding wires connected to the outside.

SUMMARY OF THE INVENTION

The present invention has been made in the light of the aforementioned problems of the semiconductor devices known heretofore described above, and a great improvement is made to the structure and the method of producing the semiconductor devices. The invention provides a key technology for such semiconductor devices, and an object of the present invention is to provide a semiconductor device capable of sufficiently satisfying requirements for future devices such as higher control speed, larger memory capacity, and higher stability in performance. Hence, the invention relates to a semiconductor device equipped with a buried type capacitor that is formed by directly burying the capacitor in a semiconductor substrate (a wafer) made of a material such as silicon and gallium. The invention further includes a particularly useful interconnection technology also useful for semiconductor devices comprising a laminate module (constitution element) having multiple layers on a semiconductor base body or a bare die (exposed chip body), which attains a high precision layer structure and assembly process therefor in semiconductor devices made from materials such as silicon and GaAs.

In order to solve the aforementioned problems, the semiconductor device according to the present invention utilizes means as follows. The attached symbols are in conformity with those shown in the drawings.

(1) A three-dimensional cavity 11 is formed aligned in a planar semiconductor substrate 10, a capacitor part A is provided with a capacitor structure of a substrate buried type directly formed by burying the capacitor structure inside the cavity 11, and semiconductor base bodies (101–103) containing the capacitor part A as one constituent, are incorporated to implement a semiconductor device.

(2) In the semiconductor device (1), the capacitor part A is constructed by implementing a capacitor structure comprising a cavity 11 having an aperture (open side) on the surface (device front) 10 of the substrate and extending to an inner part or else reaching the back surface of the substrate.

(3) In the semiconductor device (1) or (2), the cavity 11 is formed and constructed by etching using, for instance, plasma, etc.

(4) In the semiconductor device (1) to (3), an insulator layer 12 such as a silicon oxide film is formed and constructed on the surface (device front) of the semiconductor substrate 10 or on the inner surface of the cavity 11 for passivation.

(5) In the semiconductor device (1) to (4), the capacitor part A is constructed by providing a capacitor structure of a through substrate type cavity, which penetrates inside the substrate 10 from the front surface of the body 10 to the back surface.

(6) In the semiconductor device (1) to (5), the cavity 11 is provided in an approximately truncated cone shape, having a structure with its aperture opened on the front surface (device front) of the body.

(7) In the semiconductor device (1) to (6), a capacitor structure is implemented on the inner surface of the cavity part A by forming a laminated structure of a first electrode layer 13, a dielectric layer 14, and a second electrode layer 15, by means of a thin film deposition method such as CVD, sputtering, electric deposition, spin coating, painting, etc. Further preferably, a sealing material 16, such as polyimide, a metal, etc., is filled inside the concave portion provided on the upper layer of the dielectric layer 14 in the cavity 11.

(8) In the semiconductor device (7), trimming is performed on the dielectric film (dielectric layer) provided in the layer toward the front surface. Trimming refers to controlling the size and the capacity of the dielectric film (dielectric layer) by using a means such as laser, and this enables adjusting the capacitance to a proper value.

(9) In the constitution of the semiconductor device (1) to (8), the back surface of the substrate 10 at the location of the cavity 11 therein is removed by a means such as etching, etc., such that the device will have an exposed electrode layer 13'.

(10) In the constitution of the semiconductor device (1) to (9), the capacitor part A is arranged so that it can be connected to power source, ground, and a signal line.

(11) In the constitution of the semiconductor device (1) to (9), the capacitor part A is arranged so that it can be connected to a clock line.

(12) In the constitution of the semiconductor device (1) to (9), the capacitor part A is placed just under or in the periphery of the input and output pad connected to the substrate.

(13) In the constitution of the semiconductor device (1) to (12), the semiconductor device comprises a laminated module structure containing a plurality of said semiconductor base bodies (110, 111) stacked in layers, and ball bodies (120, 121) are arranged interposed among said semiconductor base bodies (110, 111).

(14) In the semiconductor device (13), the ball bodies (120, 121) have elasticity and they form a cushion structure interposed among said semiconductor base bodies.

(15) In the semiconductor device (13), the ball bodies (120, 121) have electric conductivity and they form an electrically conductive structure interposed among said semiconductor base bodies.

DETAILED DESCRIPTION OF THE PREFERRED EMBODIMENT

The mode for implementing the semiconductor device according to the present invention is described in further detail below by making reference to the attached drawings.

Figure 1:
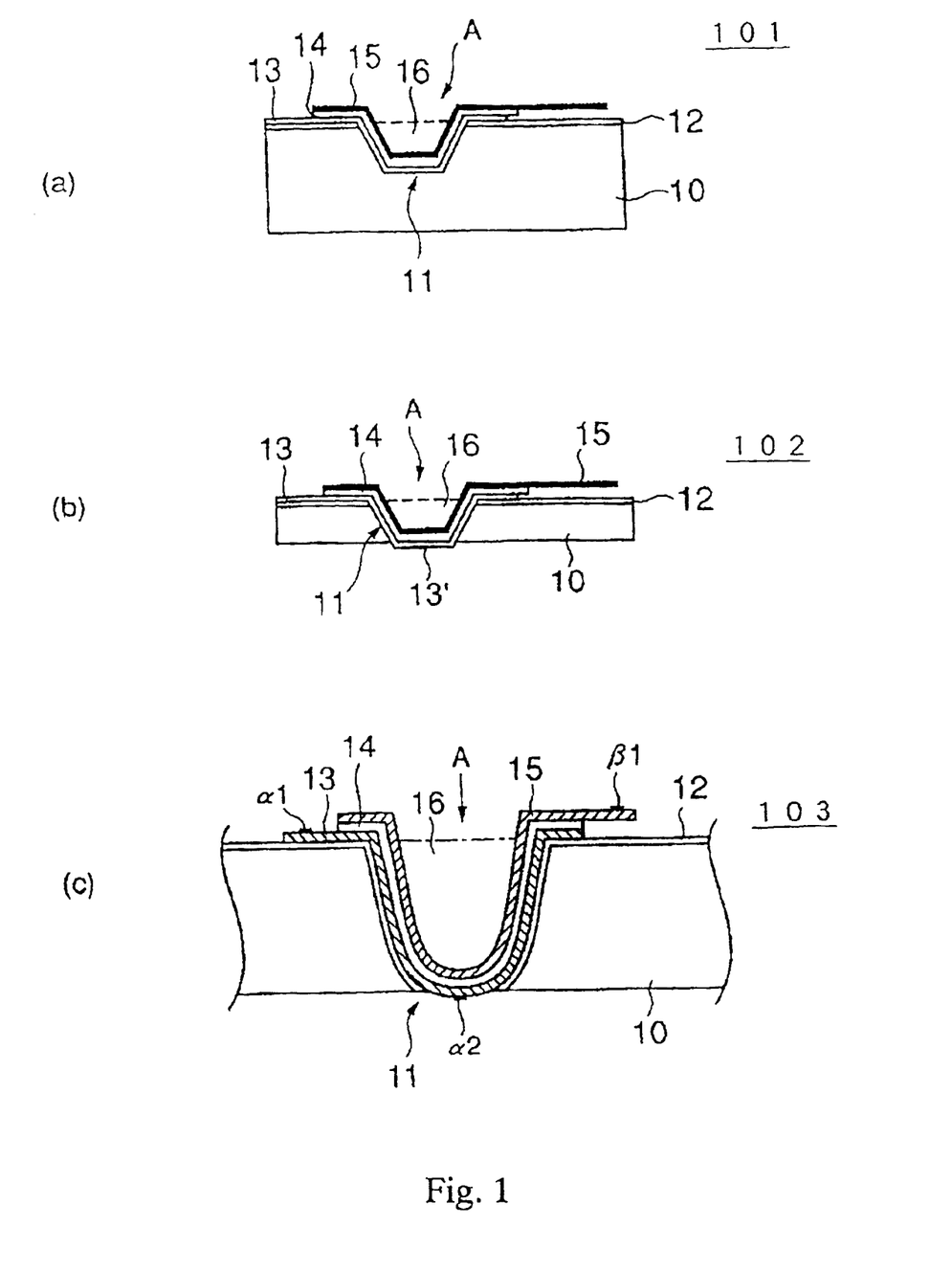
FIG.1 shows a cross section constitutional view of semiconductor base bodies (101, 102, 103) of a semiconductor device according to the present invention. In the figure, (a) shows a capacitor structure in which the bottom portion of a cavity 11 is provided inside the substrate 10 and not penetrating, (b) shows a capacitor structure in which the first electrode layer (the first metallic layer) provided to the bottom portion side of the cavity 11 is exposed, and (C) shows a capacitor structure in which the cavity has an approximately U-shaped cross section, wherein electrodes ($\alpha1$ and $\alpha2$) are provided to the first electrode layer (first metallic layer), and an electrode ($\beta1$) is provided to the second electrode layer (second metallic layer).

In FIG. 1 is given a cross section view of the constitution showing the semiconductor base bodies (101, 102, 103) constituting the semiconductor device according to the present invention. Referring to the structure shown in FIG. 1(a), a cavity 11 is formed on the surface of a substrate 10, and the bottom portion of the cavity 11 is inside the substrate 10. FIG. 1(b) shows a structure in which a means such as etching is applied from the back (bottom) surface of the substrate 10, so that the substrate material is removed, making the substrate thinner in such a manner that the first electrode layer (the first metallic layer) is exposed on the back plane (bottom plane) side of the cavity 11. Further, FIG. 11(c) shows a capacitor structure having an approximately U shaped cross section, in which electrodes ($\alpha1$ and $\alpha2$) are formed on the first electrode layer (first metallic layer) and an electrode ($\beta$) is formed on the second electrode layer (second metallic layer).

The cavity 11 formed inside the semiconductor substrate 10 has a three-dimensional structure. As an example of the three-dimensional structure, a truncated cone shape is shown in the figure, but the shape need not be limited thereto. More specifically, there can be various types of three-dimensional shapes such as a reverse truncated cone shape, cylindrical shape, dish shape, pot shape, bowl shape, vase shape, conical shape, etc. Furthermore, as the cross section shape of the three-dimensional morphologies above, there can be mentioned shapes such as circular, ellipsoidal, polygonal, and asymmetrical shapes as desired.

Referring to FIG. 1, the cavity 11 is of a structure having an aperture or an opening on the substrate 10 (device surface); the enlarged diameter side of the cavity shape has its aperture opened at the surface of the substrate 10, while the shorter diameter side forms a concave shape inside the substrate. In FIG. 1, the entire cavity is shown with an approximately truncated cone shape (reversed conical shape). The illustrated three-dimensional morphology is not limited thereto, and also can have an aperture on the surface of the substrate 10 having a diameter smaller than the lateral diameter of the cavity provided inside the substrate. More specifically, for instance, there can be provided a bucket-like morphology or a reversed bucket-like morphology, or there can be provided a triangular flask morphology or a reversed triangular flask morphology. Furthermore, straight and cylindrical or square trench shaped cavity structures constant in width, which are well known for being the cavity structure of a memory employed in a conventional DRAM device, etc., may be employed as well.

The cavity 11 comprises, in the concave portion provided to the inner plane thereof, a capacitor part A equipped with a capacitor structure buried in the substrate 10. Firstly, a cavity 11 is formed on the surface of the semiconductor substrate 10 by means of plasma etching, etc. Then, in a passivation process, a silicon dioxide (SiO$_2$) film 12 is formed on the surface of the semiconductor substrate 10 and on the inner surface of the cavity 11.

Subsequently, a first electrode layer 13 (such as Ti/W layer, etc.) is formed in the cavity 11 by means of a thin film deposition method such as CVD, sputtering, electric deposition, spin coating, painting, etc., and then, a dielectric layer 14 is laminated thereon by using a dielectric material such as polyimide (PI). Further thereon, a second electrode layer 15 is formed laminated thereon to complete a multi-layered laminate structure for capacitor part A.

Also, a capacitor part having a laminate structure formed by repeating the process steps of forming the first electrode layer 13 through the second electrode layer 15 may be provided. Alternatively, the cavity substrate surface prior to the formation of the first electrode layer 13 or the first electrode layer itself may be surface roughened by means such as sandblasting or etching to increase the area of the capacitance carrying surface, and the dielectric layer 14 and the second electrode layer 15 may be formed thereon, such that the capacitance of the capacitor formed inside the cavity may be increased.

Furthermore, preferably, a sealing material 16 such as polyimide, etc., or a metal, etc., may be filled in the concave portion generated on the upper side of the dielectric layer 14 provided inside the cavity 11. In this case, an electrically insulating material is used as the sealing material 16 at the surface in contact with the second electrode layer 15, but it may be formed otherwise by incorporating an insulating film or an insulating layer.

In FIG. 1(c) is shown another example (semiconductor base body 103) of a semiconductor device according to the present invention. The cavity 11 used herein is provided in morphology as such similar to a U-shaped cross section or a vase-like shape, such that the bottom is provided with an edge-free round shape. In this case again, similar to (a) and (b), there is constructed a capacitor part A having a multi-layered laminate structure comprising a first electrode layer 13 (e.g., a Ti/W layer, etc.), a dielectric layer 14 (made of polyimide, etc.), and a second electrode layer 15, and furthermore, the first electrode layer 13 comprises an electrode α1 on the front surface and an electrode α2 on the back side, and the second electrode layer 15 comprises an electrode β1 on the front surface. By providing such a structure, the capacitor function of the present invention can be realized by taking α1 and β1 as electrodes, or α2 and β1 as electrodes.

In a common parallel plated capacitor, the capacity C can be expressed by an equation $C=\epsilon \cdot S/D$, where S represents the area of the electrode, D represents the thickness of the dielectric (distance between the electrodes), and $\epsilon$ represents the dielectric constant of the dielectric. Thus, as is clearly understood from this equation, in order to increase the capacity C of the capacitor according to the present invention, it is important to increase the area S of the electrodes (i.e., the first electrode layer 13 and the second electrode layer 15 in the present invention), while thinning the thickness d of the dielectric (i.e., the dielectric layer 14 in the present invention) and using a material having a high dielectric constant $\epsilon$).

Figure 2:
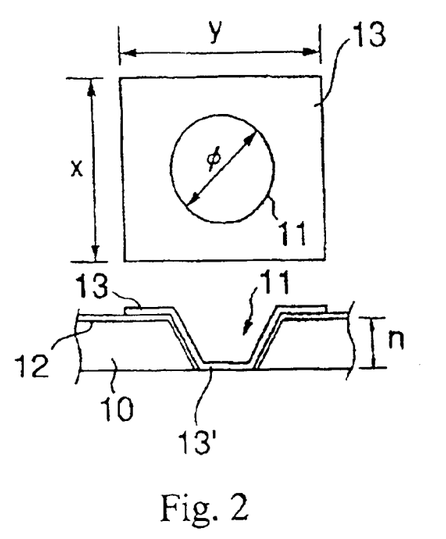
FIG. 2 shows an example of a semiconductor device according to the present invention, and provides a cross section view and an upper plan view showing the structure in which a first electrode layer 13 (Ti/W layer, etc.) is formed on the cavity 11.

In FIG. 2 is shown a semiconductor device according to the present invention, showing the cross section view and the upper plan view of a structure comprising a first electrode layer 13 (e.g., Ti/W layer, etc.) formed inside a cavity 11. The cavity 11 is formed on a substrate 10, and, in a passivation process, a silicon dioxide (SiO$_2$) film 12 is formed on the surface of the semiconductor substrate 10 and on the inner surface of the cavity 11. The first electrode layer 13 is formed in such a manner that it may continuously cover both the inner surface of the cavity 11 and the substrate surface at the periphery of the cavity. The first electrode layer 13 shown in FIG. 2 is indicated as a rectangle or a square as seen from above, with the sides x and y thereof decided by taking the size and the shape of the cavity 11 into consideration. Furthermore, the shape of the first electrode layer 13 herein is not only limited to a rectangle or a square as shown in FIG. 2, but may be of any shape such as circle or oval. Further, the depth of the cavity 11 herein may be set approximately equal to the thickness n of the substrate 10 as shown in FIG. 2, because the metallic layer 13' (i.e., the first electrode layer 13) is exposed from the back of the substrate 11. By setting a solder, a bump, etc., on the metallic layer 13' herein and by joining it with an interposer and the like, the connection with the outside may be facilitated.

Figure 3:
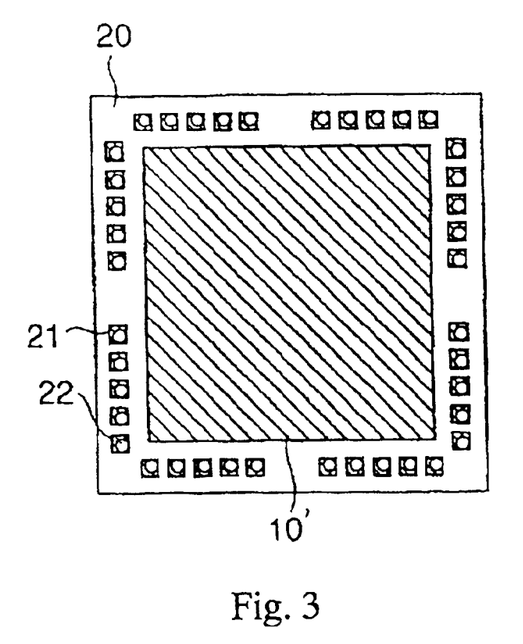
FIG. 3 shows a semiconductor chip according to an example of a semiconductor device according to the present invention, and is an upper plan view showing a constitution in which a plurality of connection pads (I/O pads) are arranged in the periphery.

In FIG. 3 is shown an upper planar view of a semiconductor chip according to an example of the semiconductor device of the present invention. A silicon substrate 10' is connected in contact with a chip substrate 20, and a pad portion (e.g., 21, 22, etc.) is provided to the periphery thereof. On designing the semiconductor chip here in case of using a silicon substrate of a proper size, for instance, the thickness of the silicon substrate 10 may be set to approximately 200 μm, and the cavities may be set to 10–12 pcs/line×4=48 pcs [max.], while freely arranging the cavities.

Referring to FIG. 3, a plurality of pad portions (e.g., 21, 22, etc.) for external connection are arranged on the periphery of the silicon substrate 10'. The pad portions (e.g., 21, 22, etc.) can be formed as capacitors with structure according to the present invention. In accordance with the semiconductor device of the present invention, as shown in FIG. 1(C), the structure is provided as such that the capacitor electrodes may be taken from the front side (e.g., α1 and α2), or one electrode each taken from the front and the back sides (e.g., α2 and β1) of the substrate. By appropriately combining the electrodes, the electrode (bonding pad) provided to the periphery of the IC chip surface can be connected simply to the lead frame, and this largely contributes to the realization of efficient design, reduced product size, etc., thereby leading to the production of a product matching the market needs.

Figure 4:
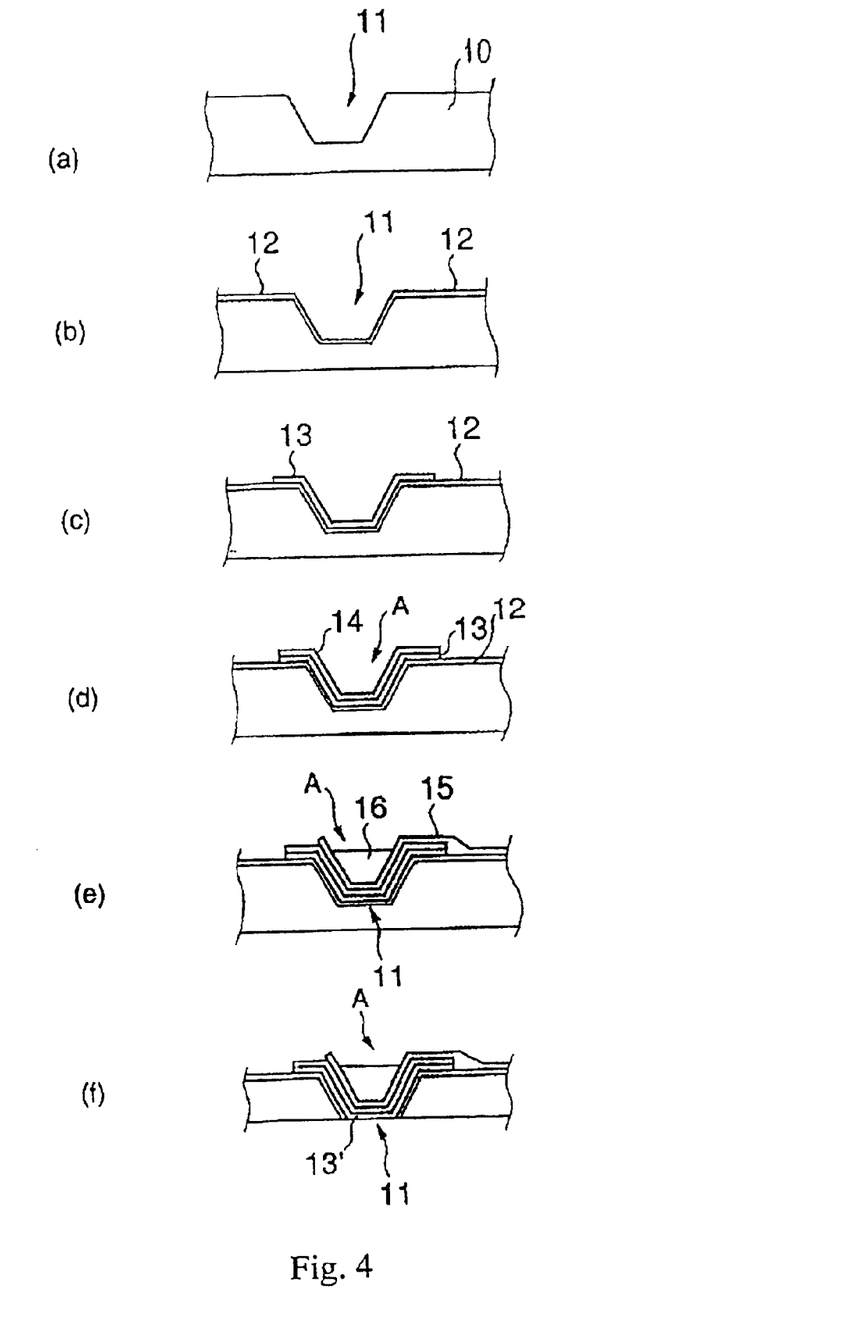
FIG. 4 shows an example of the flow of manufacture processes of a semiconductor base body of a semiconductor device according to the present invention, and it provides the process steps showing the procedure of forming a cavity and a capacitor part having a laminate structure.

FIG. 4 is related to the production of a semiconductor device according to the present invention, and shows an example of the process steps for forming a cavity and a capacitor part according to the capacitor laminated structure.

(a) The semiconductor substrate (wafer) 10 is made of a material such as of silicon, gallium arsenide, etc., and a three-dimensional cavity 11 is formed in such a manner that the aperture is formed on the surface of the substrate. The cavity may be formed by properly selecting a means such as plasma etching, etc. The cavity is aligned and formed by setting, for instance, the morphology, the size, the cavity depth, the number, the interval, and the location, based on the design of the semiconductor device.

(b) A silicon oxide film (e.g., SiO$_2$ layer) 12 is formed on the surface of the semiconductor substrate 10 and on the inner plane of the cavity 11 in a passivation process.

(c) A first electrode layer (a first metallic layer) 13 is formed by attaching Ti/W, etc.

(d) A dielectric layer 14 using a dielectric material such as polyimide (PI) is formed by laminating it on the first electrode layer 13.

(e) A second electrode layer (a second metallic layer) 15 is formed superposed on the first electrode layer (first metallic layer) 13 and the dielectric layer 14.

In the process steps (d) or (e), a part or a large part of the first electrode layer 13 may be exposed on the substrate surface in such a manner that an electrode may be connected to the first electrode layer (first metallic layer) 13 provided to the surface of the substrate 10.

Furthermore, on forming a thin film in the process steps (c), (d), and (e), a means of thin film deposition such as CVD, sputtering, electric deposition, spin coating, painting, etc., may be properly employed. (f) In this example of this process step, the front surface of the substrate 10 and the surface exposed opposite thereto (i.e., the back or lower surface) at the cavity 11 provided therein are thinned by means of etching, etc., such that a part or the entire surface at the cavity may be removed, exposing the electrode layer 13'. A capacitor part A is formed in this manner. Thus, a first electrode layer (first metallic layer) is exposed at the bottom plane (lower plane) of the cavity 11, and this can be used as the capacitor electrode.

Figure 5:
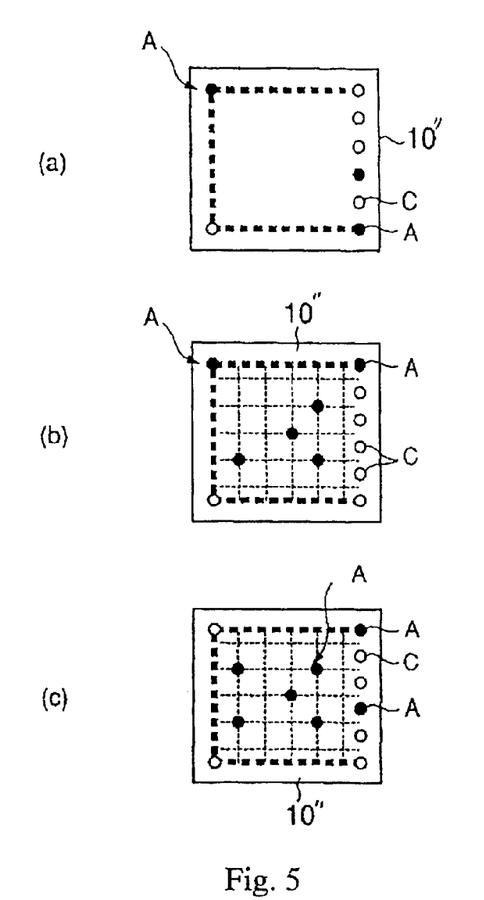
FIG. 5 shows an arrangement structure showing various arrangements of the capacitor part having a capacitor layered structure in a semiconductor device according to the present invention, wherein (a) is an example in which a plurality of capacitors A are arranged in the periphery of the semiconductor substrate 10, (b) is an example of an arrangement in which the capacitor part A is connected to power source, GND, and signal line, and (c) is an example of an arrangement in which the capacitor part A is connected to a clock line.

In FIG. 5 is an structure diagram showing various types of arrangements of a capacitor part A having a capacitor laminate structure of the semiconductor device according to the present invention. Referring to the figure, a filled circle represents an I/O pad (A) comprising a capacitor part in which the capacitor structure according to the present invention is applied, and open circle represents an I/O pad C) of a conventional type having no capacitor part according to the present invention. The I/O pad (filled circle) (A) according to the present invention may be properly and freely used in combination with the conventional I/O pad (open circle) (C) and arranged on the semiconductor substrate to constitute various types of semiconductor devices. As the semiconductor substrate, as a matter of course, used are not only those made of silicon, but also substrates made of other materials such as GaAs.

In FIG. 5(*a*) is shown an example in which a plurality of capacitor parts A according to the present invention are arranged and set in the periphery of the semiconductor substrate 10". The capacitor structure of this type may be set up as a pad portion connected to an interposer etc. Preferably, capacitor parts C of conventional types may be properly combined and arranged on the semiconductor substrate.

The signal quality of the signals provided in the signal line can be improved in this manner by aligning a capacitor structure according to the present invention just under the I/O pad provided in the semiconductor substrate, or in the periphery thereof.

Further, in FIG. 5(*b*) is shown an example of aligning the capacitor part A according to the present invention in a manner suitable for connection with a power source, GND, and signal line. By aligning the capacitor part A according to the present invention as a decoupling capacitor for the power source—GND line, a semiconductor device assuring an extremely high speed operation can be implemented.

In FIG. 5(*c*) is shown an example of aligning the capacitor part A according to the present invention in a manner suitable for connection with a clock line. By aligning the capacitor part A to a clock line within the silicon substrate 10" as a capacitor differing in capacitance value, it can greatly contribute to energy management.

The present invention further comprises a particularly useful method of interconnection among base bodies, i.e., the key technology for semiconductor devices, and it provides a technology for forming a laminate module (constitution element) having multiple layers on a base body or an exposed chip body (bare die). Further, this interconnection technology can be effectively applied to the high precision layer structure and the assembly process of semiconductor devices made from semiconductor materials such as silicon and GaAs.

Figure 6:
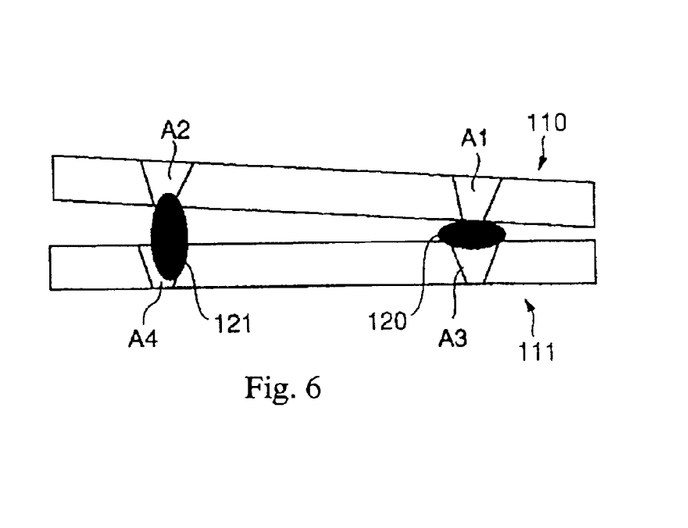
FIG. 6 refers to a semiconductor device according to the present invention, and it provides a cross section of an explanatory structure view of interconnection of a plurality of semiconductor base bodies (110, 111) by using ball bodies (120, 121).

FIG. 6 refers to a semiconductor device according to the present invention, and is an explanatory diagram showing the cross section view of the structure of an example for constituting an interconnection structure by using ball bodies (120, 121) placed between a plurality of semiconductor base bodies (110, 111).

The semiconductor device according to FIG. 6 can provide a module structure as a 3D-laminate package in which plural semiconductor base bodies (110, 111) are superposed in layers, and in this case, the ball bodies (120, 121) are preferably interposed between the capacitor-type through holes (A1–A3, A2–A4) of the semiconductor base bodies (110, 111).

Furthermore, by using a material having elasticity for the ball bodies (120, 121), a cushion structure may be formed among said semiconductor base bodies (110, 111).

Further, said ball bodies (120, 121) may have electric conductivity, such that an electrically conductive structure may be formed between the through holes (A1–A3, A2–A4) of the capacitor parts of said semiconductor base bodies.

By connecting the capacitor type through hole semiconductor base bodies by using elastic solder ball bodies in this manner, a favorable combination structure can be implemented.

As described above, the technology according to the present invention comprising forming an interconnection (an internal connected structure) by using elastic balls that are directly interposed or inserted inside the module (constituent component) is extremely useful for the high precision layer structure and the assembly process of the future semiconductor chips.

In a semiconductor device known heretofore, a protective film was provided on the wafer or the base body, such that the narrow gaps between each of the wafers would be controlled to yield a proper pressure, and there was a requirement that a precise module must have surface planarity of high precision in the thin film wafers and base bodies. However, in accordance with the present invention, the technology above for maintaining the narrow gaps is no longer necessary. Accordingly, the elastic support structure using the ball bodies is found to be a useful technology in improving future high precision layer structures and the assembly processes.

As described above, the semiconductor device according to the present invention shows distinguished features, and provides excellent advantages as follows.

(1) The semiconductor device according to the present invention comprises a constitution comprising a capacitor part A buried in a silicon substrate, thereby minimizing the inductor (L component) included in the circuit and realizing a high speed operation. Further, not only silicon substrate materials, but also other materials such as GaAs can be employed for the substrate.

(2) In accordance with the structure and the production process for semiconductor devices of the present invention, when compared with the capacitance (several fF) obtained in the conventional devices employing a trench structure, the semiconductor device according to the present invention can produce a value ranging from several tens of pF to a larger value of several nF with a single cavity.

(3) In accordance with the structure and the production process for semiconductor devices of the present invention, the allowance of the capacitance can be controlled to a margin of error which is only a few percent that of conventional chips.

(4) According to the present semiconductor device, several structural improvements can be made by applying a capacitor structure of the present invention just above or just below, or in the vicinity, of each of the I/O pads on the silicon substrate. Hence, the design and the production of the capacitor can be made extremely reasonably and efficiently, and this largely contributes to the realization of reduced product size, chip size packaging, improved high performance, etc., thereby leading to the production of a product matching the market needs.

(5) In the semiconductor device according to the present invention, the proper value for capacitance can be controlled by trimming the dielectric film (dielectric layer) provided on the layer at the front surface. Trimming refers to a method of controlling the size and the capacitance of the dielectric film (dielectric layer) by using a laser, etc.

(6) In the semiconductor device according to the present invention, if necessary, the electrode of the capacitor formed inside a substrate such as silicon or GaAs can be connected to the signal line (power source, GND, or a signal line) provided just under it.

(7) In the semiconductor device according to the present invention, by providing elastic ball bodies between the semiconductor base bodies, the problem of chipping occurring on thin film wafers and base bodies can be overcome, and mechanical stress can be absorbed by the elastic function of the ball bodies. Furthermore, since the narrow gaps between each of the wafers and bare dies (exposed chip bodies) as well as the self alignment can be easily controlled by the elastic properties and the operation thereof, a semiconductor device of high performance can be easily implemented.

What is claimed is:

1. A semiconductor device, comprising:
a semiconductor base body including a capacitor part, the capacitor part being buried in a planar semiconductor substrate in a three-dimensional cavity therein, the cavity extending through the substrate by penetrating from a front surface to a back side of the substrate, an insulating layer formed on the front surface and on the inner surface of the cavity, a laminate structure comprising a first electrode layer, a dielectric layer, and a second electrode layer formed inside of the cavity, each layer being a film, the first electrode layer being exposed from the back side surface of the substrate, and the capacitor part including a concave portion on the front surface of the substrate.

2. A semiconductor device as claimed in claim 1, wherein:
the concave portion is filed with an insulating material.

3. A semiconductor device as claimed in claim 1, wherein:
the second electrode layer has an exposed part on the front side of the substrate and the first electrode layer includes an exposed part on the front side of the substrate.

4. A semiconductor device as claimed in claim 1, wherein:
the capacitor part is aligned as a decoupling capacitor for the power source and a ground line of the silicon substrate.

5. A semiconductor device as claimed in claim 1, wherein:
the capacitor part is disposed under input and output pads connected to the substrate.

6. A semiconductor device as claimed in claim 1, wherein:
the capacitor part is disposed in a periphery of input and output pads connected to the substrate.

7. A semiconductor device as claimed in claim 1, wherein the semiconductor device comprises:
a plurality of the semiconductor base bodies stacked in layers, and electrically conductive ball bodies interposed among the semiconductor base bodies, and wherein the electrically conductive ball bodies are placed in a concave portion of the capacitor parts of the base bodies.

8. A semiconductor device as claimed in claim 2, wherein:
the second electrode layer has an exposed part on the front side of the substrate and the first electrode layer includes an exposed part on the front side of the substrate.

9. A semiconductor device as claimed in claim 2, wherein:
the capacitor part is aligned as a decoupling capacitor for the power source and a ground line of the silicon substrate.

10. A semiconductor device as claimed in claim 3, wherein:
the capacitor part is aligned as a decoupling capacitor for the power source and a ground line of the silicon substrate.

11. A semiconductor device as claimed in claim 7, wherein:
the capacitor part is aligned as a decoupling capacitor for the power source and a ground line of the silicon substrate.

12. A semiconductor device as claimed in claim 2, wherein:
the capacitor part is disposed under input and output pads connected to the substrate.

13. A semiconductor device as claimed in claim 3, wherein:
the capacitor part is disposed under input and output pads connected to the substrate.

14. A semiconductor device as claimed in claim 4, wherein:
the capacitor part is disposed under input and output pads connected to the substrate.

15. A semiconductor device as claimed in claim 8, wherein:
the capacitor part is disposed under input and output pads connected to the substrate.

16. A semiconductor device as claimed in claim 9, wherein:
the capacitor part is disposed under input and output pads connected to the substrate.

17. A semiconductor device as claimed in claim 10, wherein:
the capacitor part is disposed under input and output pads connected to the substrate.

18. A semiconductor device as claimed in claim 11, wherein:
the capacitor part is disposed under input and output pads connected to the substrate.

19. A semiconductor device as claimed in claim 2, wherein the semiconductor device comprises:
a plurality of the semiconductor base bodies stacked in layers, and electrically conductive ball bodies interposed among the semiconductor base bodies, the electrically conductive ball bodies are placed in a concave portion of the capacitor parts of the base bodies.

* * * * *